(12) United States Patent
Shenoy

(10) Patent No.: US 10,998,403 B2
(45) Date of Patent: May 4, 2021

(54) DEVICE WITH INCREASED FORWARD BIASED SAFE OPERATING AREA (FBSOA) THROUGH USING SOURCE SEGMENTS HAVING DIFFERENT THRESHOLD VOLTAGES

(71) Applicant: Infineon Technologies Americas Corp., El Segundo, CA (US)

(72) Inventor: Praveen Shenoy, Chandler, AZ (US)

(73) Assignee: INFINEON TECHNOLOGIES AMERICAS CORP., El Segundo, CA (US)

( * ) Notice: Subject to any disclaimer, the term of this patent is extended or adjusted under 35 U.S.C. 154(b) by 95 days.

(21) Appl. No.: 16/291,537

(22) Filed: Mar. 4, 2019

(65) Prior Publication Data

US 2020/0286994 A1 Sep. 10, 2020

(51) Int. Cl.
*H01L 29/08* (2006.01)
*H01L 29/06* (2006.01)
*H01L 29/78* (2006.01)

(52) U.S. Cl.
CPC ...... *H01L 29/0869* (2013.01); *H01L 29/0696* (2013.01); *H01L 29/086* (2013.01); *H01L 29/0865* (2013.01); *H01L 29/7813* (2013.01)

(58) Field of Classification Search
CPC .......................... H01L 29/66712–66734; H01L 29/7802–7815; H01L 29/0856–0869; H01L 29/0696; H01L 29/7395–7397; H01L 29/66333–66348
See application file for complete search history.

(56) References Cited

U.S. PATENT DOCUMENTS

| | | | | |
|---|---|---|---|---|
| 5,023,691 A * | 6/1991 | Hagino | ............... | H01L 29/0696 257/139 |
| 8,436,367 B1 * | 5/2013 | Sdrulla | ............... | H01L 29/1095 257/77 |
| 10,833,671 B2 * | 11/2020 | Shenoy | ............... | H01L 29/7802 |
| 2003/0034522 A1 * | 2/2003 | Klodzinski | ........... | H01L 29/086 257/346 |
| 2006/0124996 A1 * | 6/2006 | Mizokuchi | .......... | H01L 29/7813 257/330 |
| 2013/0187195 A1 * | 7/2013 | Rothleitner | ......... | H01L 29/7397 257/139 |
| 2015/0115355 A1 * | 4/2015 | Hirler | ................. | H01L 29/1095 257/331 |
| 2015/0187919 A1 * | 7/2015 | Song | ................... | H01L 29/0696 257/139 |
| 2015/0372089 A1 * | 12/2015 | Bolotnikov | ......... | H01L 29/0878 257/77 |
| 2016/0163854 A1 * | 6/2016 | Nishimura | .......... | H01L 29/1095 257/330 |
| 2016/0181365 A1 * | 6/2016 | Bolotnikov | ......... | H01L 29/0692 257/329 |
| 2017/0018609 A1 * | 1/2017 | Hoshi | ..................... | H01L 29/78 |
| 2017/0069729 A1 * | 3/2017 | Nishiwaki | ............. | H01L 29/423 |

* cited by examiner

*Primary Examiner* — Younes Boulghassoul
(74) *Attorney, Agent, or Firm* — Slater Matsil, LLP

(57) ABSTRACT

A power device includes a gate, and a segmented source adjacent to the gate, wherein the segmented source includes segments having a first threshold voltage and includes segments having a second threshold voltage different from the first threshold voltage.

20 Claims, 12 Drawing Sheets

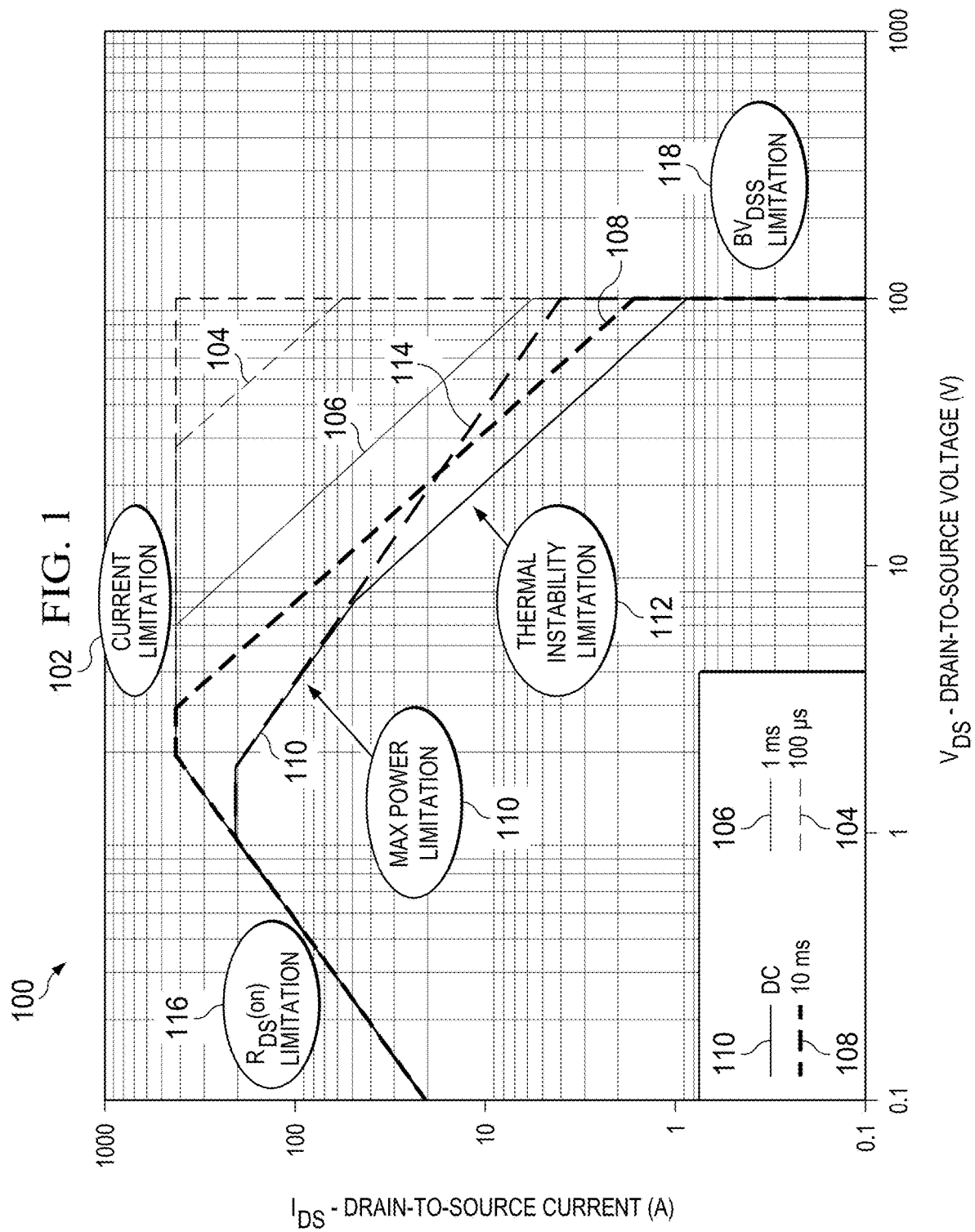

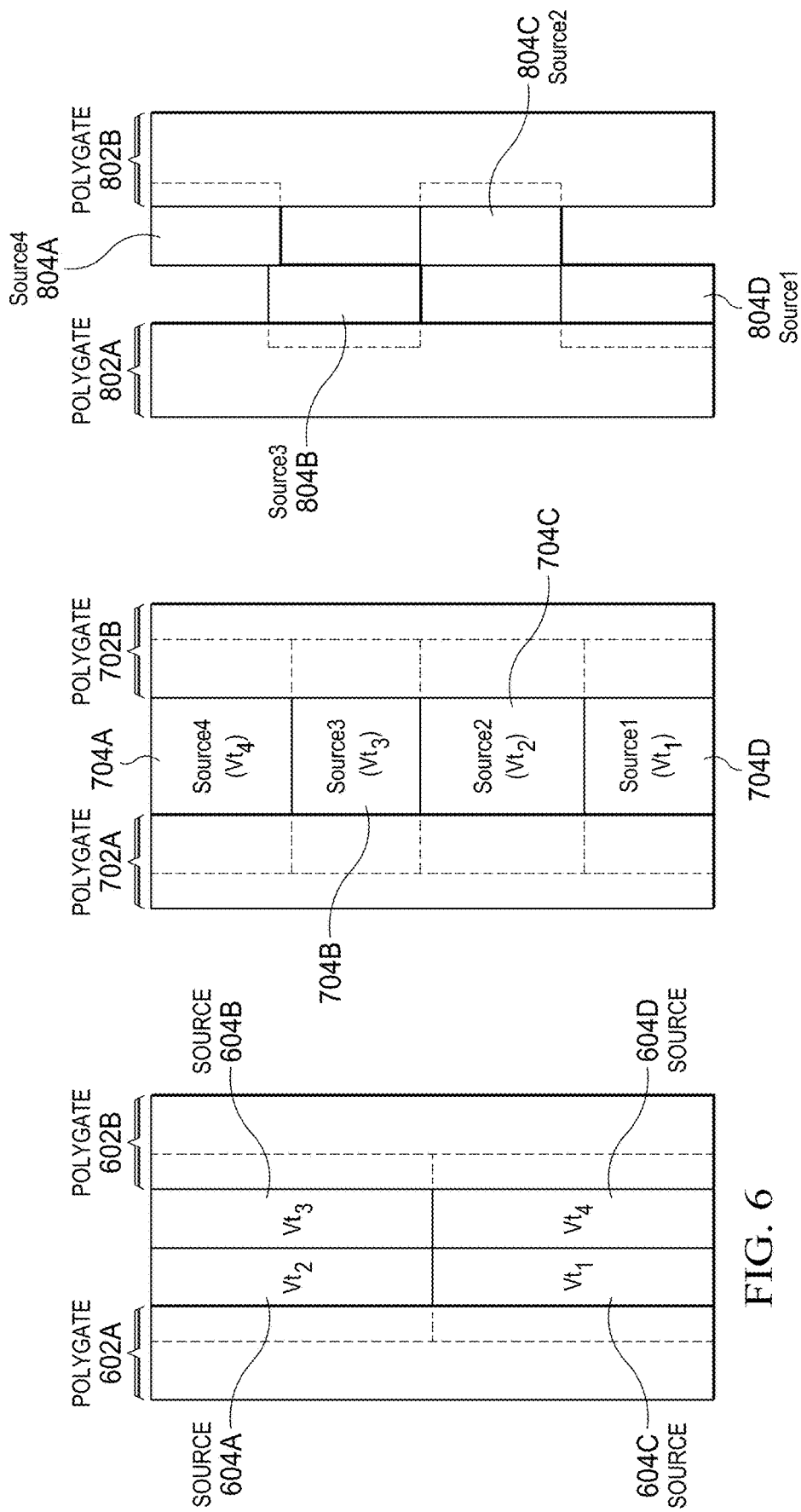

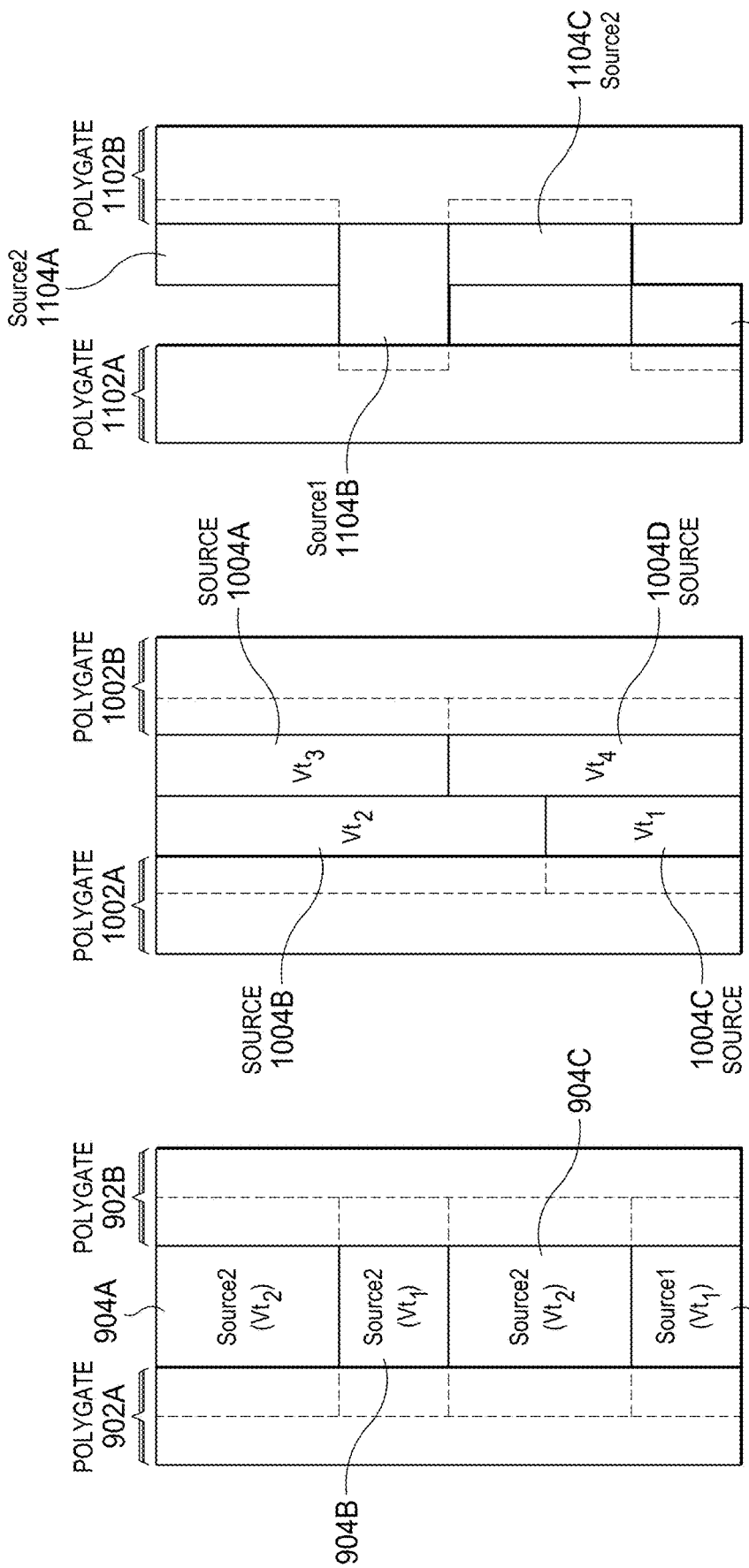

| WELL AND CELL GEOMETRIES | LINEAR CELL 2202 | SQUARE WELL IN SQUARE CELL 2204 | CIRCLE IN SQUARE CELL 2206 | HEXAGON IN SQUARE CELL 2208 | SQUARE IN HEXAGONAL CELL 2210 | CIRCLE IN HEXAGONAL CELL 2212 | HEXAGON IN HEXAGONAL CELL 2214 |
|---|---|---|---|---|---|---|---|
| UNIT CELL | s+a, s | s+a, s | s | s | s+a, s | s | s |

FIG. 14

| DESIGN | $Vt_1$ | $Vt_2$ | $\Delta Vt$ | Tm divg | Rdson |
|---|---|---|---|---|---|
|  | V | V | V | C | mOhm |
| CONVENTIONAL | 3.53 | 3.53 | 0.00 | 20.6 | 31.7 |
| 50% Gm | 3.62 | 3.62 | 0.00 | 10.9 | 43.0 |
| DUAL Vt (50% LOW Vt) | 3.45 | 3.79 | 0.34 | 16.7 | 32.2 |
| DUAL Vt (50% LOW Vt) | 3.43 | 4.02 | 0.59 | 11.2 | 33.2 |

FIG. 16

| DESIGN | Rdson | SOA ID RANGE | SOA Avg_Id | % INCREASE |
|---|---|---|---|---|
|  | mOhm | A | A |  |
| CONVENTIONAL | 48 | 2.7-3.3 | 2.92 |  |
| DUAL Vt STRIPE | 48 | 3.7-4.0 | 3.79 | 30% |

FIG. 17

DEVICE WITH INCREASED FORWARD BIASED SAFE OPERATING AREA (FBSOA) THROUGH USING SOURCE SEGMENTS HAVING DIFFERENT THRESHOLD VOLTAGES

TECHNICAL FIELD

The present invention relates generally to a device and method for increasing Forward Biased Safe Operating Area ("FBSOA") using different threshold voltage source segments.

BACKGROUND

Generally, for power semiconductor devices operating in the forward biased "on" state, FBSOA is defined as the available voltage and current conditions over which the device can be expected to operate without causing self-damage. FBSOA is therefore an important consideration in linear mode applications and in the design and use of pass-through Field-Effect Transistors ("FETs"). N-channel Metal-Oxide-Semiconductor FETs ("MOSFETs") are usually used in switching applications and hence FBSOA is sacrificed for $R_{DS(on)}$ and other parameters. P-channel MOSFETs are usually used in linear mode applications and hence FBSOA is also an important parameter for these devices as well.

It is difficult to improve FBSOA significantly, and operation beyond the FBSOA voltage and current limits will result in a breakdown of the device. Breakdown mechanisms can include, for example, localized heating within the device even if the device is operating with the maximum allowable current and voltage limits, as well as other breakdown mechanisms such as failure of dielectric regions due to the application of excessive voltages, or failure of current carrying structures within and associated with the device due to the application of excessive currents.

SUMMARY

In accordance with an embodiment, a power device includes a gate, and a segmented source proximate to the gate, where the segmented source includes a plurality of first segments having a first threshold voltage and a plurality of second segments having a second threshold voltage different from the first threshold voltage.

BRIEF DESCRIPTION OF THE DRAWINGS

For a more complete understanding of the present invention, and the advantages thereof, reference is now made to the following descriptions taken in conjunction with the accompanying drawings, in which:

FIG. 1 is a chart of FBSOA for a typical power device;

FIG. 6 is a plan view of a power device according to an embodiment comprising a multiple threshold voltage stripe design comprising a first source stripe having a first threshold voltage source segment and a second threshold voltage source segment, and a second source stripe having a third threshold voltage source segment and a fourth threshold voltage source segment;

FIG. 7 is a plan view of a power device according to an embodiment comprising a laddered multiple threshold voltage design comprising a first threshold voltage source segment, a second threshold voltage source segment, a third threshold voltage source segment; and a fourth threshold voltage source segment;

FIG. 8 is a cross-sectional view of a power device according to an embodiment comprising a checkered source design having multiple threshold voltage source segments, comprising a first threshold voltage source segment associated with a first gate stripe, a second threshold voltage source segment associated with a second gate stripe, a third threshold voltage source segment associated with the first gate stripe, and a fourth threshold voltage source segment associated with the second gate stripe;

FIG. 9 is a plan view of a power device according to an embodiment comprising an asymmetrical dual threshold voltage ladder having a plurality of first threshold voltage source segments, and a plurality of second threshold voltage source segments, wherein the second threshold voltage source segments have an area larger than that of the first threshold voltage source segments;

FIG. 10 is a plan view of a power device according to an embodiment comprising an asymmetrical multiple threshold voltage stripe design comprising a first source stripe having a first threshold voltage source segment and a second threshold voltage source segment, and a second source stripe having a third threshold voltage source segment and a fourth threshold voltage source segment, wherein source segment endpoints are staggered;

FIG. 11 is a plan view of a power device according to an embodiment comprising an asymmetrical dual threshold voltage checkered pattern comprising first threshold voltage source segments associated with a first gate stripe and second threshold voltage source segments associated with a second gate stripe, wherein the second threshold voltage source segments have an area larger than that of the first threshold voltage source segments;

FIG. 14 illustrates plan views of various power device cell configurations suitable for comprising segmented sources according to embodiments;

FIG. 16 is a table of simulation results for assessing the performance of segmented source devices according to embodiments;

FIG. 17 is a table of experimental results for assessing the performance of segmented source devices according to embodiments;

Figure 2A:
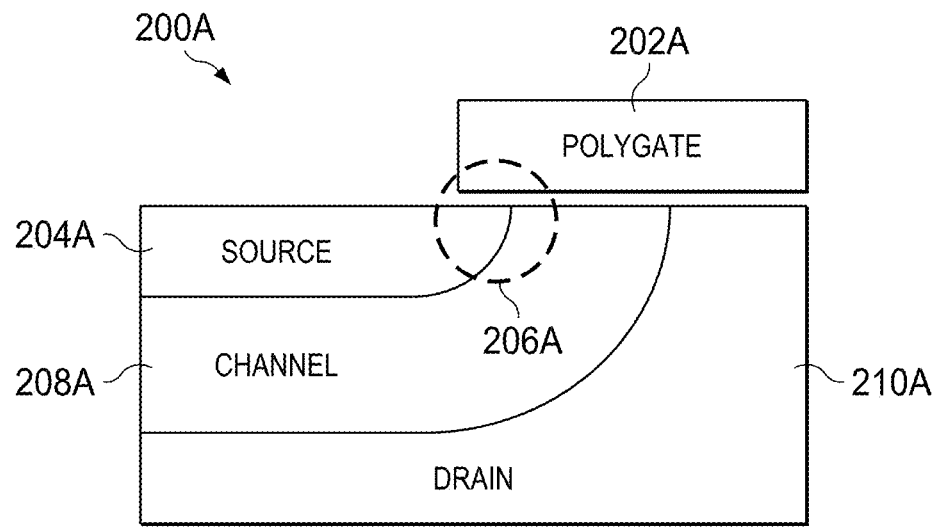
FIG. 2A is a cross-sectional view of a power device with a first source or source segment having a first threshold voltage.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

FIG. 1 shows FBSOA 100 as the area under various limitation curves. For example, FBSOA is limited by a maximum current limitation 102. FBSOA is also limited by maximum power limitations. Power limitation curves are shown for 100 µs (104), 1 ms (106), 10 ms (108), and DC (110). A thermal instability limitation curve 112 and a $R_{DS(on)}$ limitation curve 116 are also shown in FIG. 1.

FBSOA is determined by a complex chain of events involving electrical and thermal imbalances, amplified by a positive feedback at current levels below the zero-temperature coefficient point. A biasing point exists where the drain current and the transconductance of a device are temperature independent. Such a point is known as the zero-temperature coefficient (ZTC) bias point.

An imbalance in electrical characteristics, particularly in the device channel (threshold voltage Vt, and transconductance Gm) may cause higher current density in one location. This leads to higher local power dissipation, resulting in a higher temperature, which then causes lower Vt, thus leading to even higher currents and the cycle continues eventually causing thermal runaway. Even in the absence of electrical imbalances, an inherent thermal impedance imbalance between a die center and die edge causes the center of die to be hotter which then leads to electrical imbalance in Vt leading to eventual thermal run away.

This thermal imbalance is more pronounced in large versus small die leading to failures in die center at currents not proportional to die area.

Referring again to FIG. 1, the thermal instability region reduces FBSOA at high voltages as is seen in limitation curve 112. Reducing the thermal instability would result in an improved maximum power slope as shown by dashed line 114. It is clear that reducing thermal instability significantly increases FBSOA at higher voltages.

For maximizing FBSOA, a relatively low Gm is desirable. However, for minimizing RDson, a relatively high Gm is desirable. These are conflicting requirements that are difficult to resolve within a single power device.

According to embodiments described herein, the FBSOA of a transistor can be increased without significantly increasing RDson. Each transistor includes multiple Vt source segments, wherein the source segments are energized over different operating conditions, which improves FBSOA with a only a minimal increase in RDson. The Vt of the source segments can be realized in various ways including, for example, adjust a width of the source segment.

According to embodiments described herein, the transconductance of a transistor (Gm) can be reduced by reducing the channel width W.

It is known that Gm=K*Vd*W/L, wherein K is a proportionality constant, Vd is the drain voltage, W is the channel width of the transistor, and L is the channel length of the transistor.

However, when channel width W is reduced, channel resistance and current spreading resistance increases. This increases the drain-to-source resistance, Rdson. Using dual (or multiple) Vt segments as described with respect to embodiments herein, a low Gm can be achieved for an increased FBSOA and a high Gm can be achieved for a low Rdson. Source segments including low and high threshold voltages Vt are distributed uniformly throughout zones of the power device die, so that FBSOA can be improved without sacrificing Rdson. Various other methods can be used to achieve the multiple threshold voltage Vt source segments, at least one of which is described herein. According to embodiments, multiple Vt source segments are used in a power device integrated circuit die to improve FBSOA with a minimal sacrifice of Rdson.

Vertical devices are shown and described herein having a vertical current flow between one or more doped source regions at the surface of the device and a common drain and/or drift region at the bottom surface of the device, and wherein the vertical current flow is control by an application of voltage to a polysilicon gate over a channel region between the source region and the drain region. Other devices such as planar devices can also be used. Embodiment concepts can be applied to such power devices as bipolar junction transistors (BJTs), metal-oxide semiconductor field-effect transistors (MOSFETs), thyristors, or insulated-gate bipolar transistors (IGBTs), for example. Other device types can also be used. The source and drain regions described herein can be doped to be either n-type or p-type doped regions.

FIG. 2A illustrates a cross-sectional view of a power device 200A, with a first source or source segment having a first threshold voltage. Power device 200A includes a polysilicon gate 202A and a source 204A. Note that polysilicon gate 202A extends over source 206A in dotted region 206A. Power device 200A also includes a channel 208A and a drain 210A, such that the current flow is in a vertical direction through the power device 200A. The threshold voltage in power device 200A has a "normal" or base level.

Figure 2B:
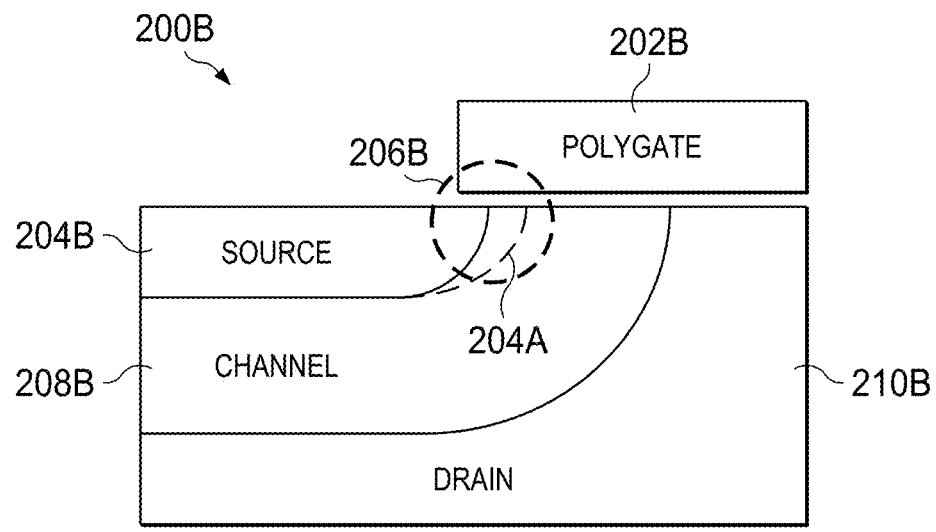
FIG. 2B is a cross-sectional view of a power device with a second source or source segment having a second threshold voltage.

FIG. 2B shows a cross-sectional view of a power device 200B, with a second source or source segment having a second threshold voltage higher than the first threshold voltage of power device 200A shown in FIG. 2A. Power device 200B includes a polysilicon gate 202B and a source 204B. Note that polysilicon gate 202B does not extend over source 206B in dotted region 206B. Power device 200B also includes a channel 208B and a drain 210B, such that the current flow is in a vertical direction through the power device 200A. The threshold voltage in power device 200B is higher than that of power device 200A since the source diffusion region 204B is smaller than source diffusion region 204A (shown as a dotted line in FIG. 2B).

During a first set of normal operating conditions, and within the FBSOA limits, a relatively low transconductance is realized. During this first set of normal operating conditions, the drain-to-source voltage of the device Vds is relatively high, and the gate-to-source voltage Vgs is relatively low—slightly above the threshold voltage Vt. The device current is carried mainly by device areas having a lower Vt. Device areas having a higher Vt will hardly conduct at the lower Vgs value. Transconductance (Gm) during FBSOA is thus dominated by the lower Vt areas and this relatively low Gm can be used to design a device based on improved FBSOA requirements.

During a second set of normal operating conditions, and within the FBSOA limits, a relatively high transconductance is realized. As previously discussed, a high transconductance is desirable for a low Rdson value. In the second set of operating condition, Vds is low, and Vgs is high—usually approximately boy above Vt. Both low and high Vt areas are thus fully inverted and both areas conduct current well. Transconductance (Gm) for designing Rdson in a device comes from the full channel area and this high Gm gives a corresponding low Rdson.

Various embodiments of power devices using multiple source segments that have at least two different corresponding threshold voltages to achieve maximum FBSOA with only minimum increases in Rdson are described below. The area of a source segment and the "total source area" referenced below may refer to a single instance of the cell configuration of gate and source segments depicted in a particular drawing figure, but it is noted that the particular configuration may be replicated dozens or hundreds of times in an actual power device integrated circuit die. The ratio of the area of a source segment to the total source area may be constant within the integrated circuit die, or may change with respect to a distance from the center of the die as is discussed in further detail below in embodiments.

Figure 3:
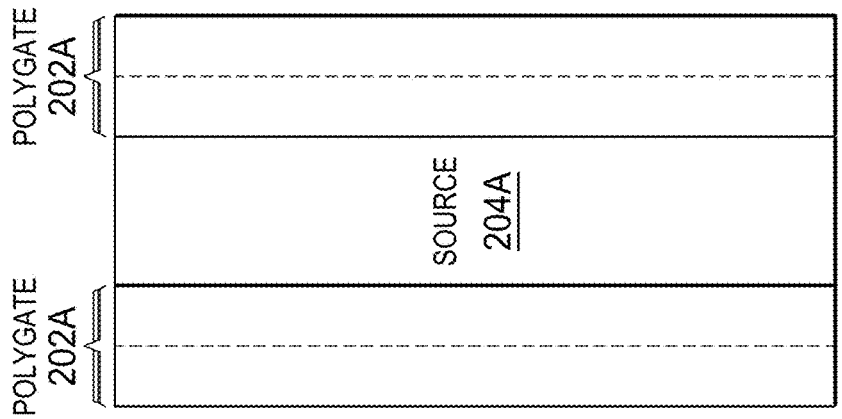
FIG. 3 is a plan view of the power device shown in FIG. 2A comprising two gate stripes and a single source stripe.

FIG. 3 is a plan view corresponding to the power device 200A shown in FIG. 2A comprising two gate stripes 202A and a single source stripe 204. The typical power device shown in FIG. 3 may suffer thermal instability limitations at higher voltages along curve 112 as is explained above with respect to FIG. 1. Note that polysilicon gates 202A overlap source region 204A, as was shown in the cross-sectional view of power device 200A in FIG. 2A.

Figure 4:
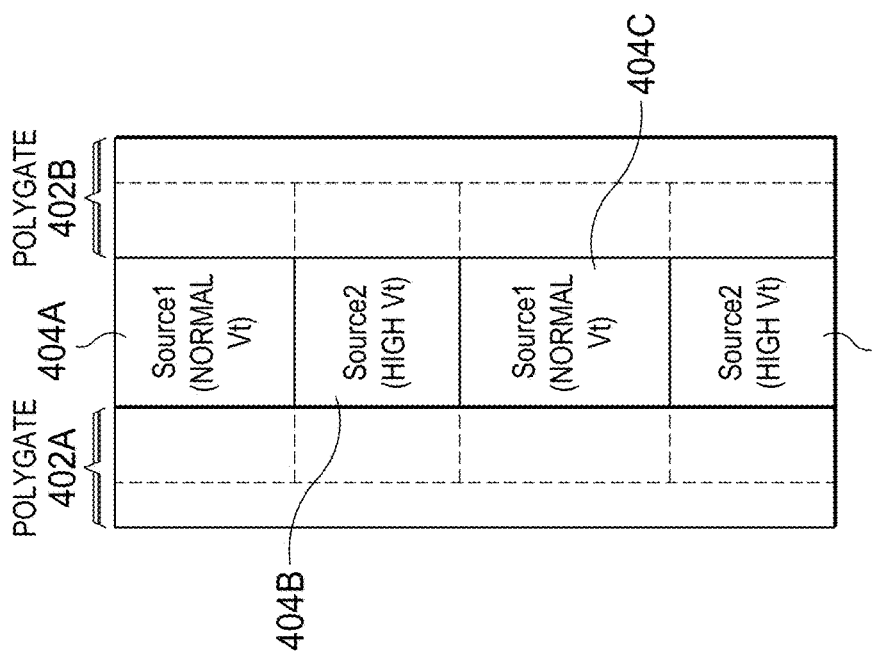
FIG. 4 is a plan view of a power device according to an embodiment comprising a laddered dual source comprising a plurality of first source segments having a first threshold voltage and a plurality of second source segments having a second threshold voltage.

FIG. 4 is a plan view of a power device having a symmetrical laddered source according to an embodiment comprising a laddered dual source comprising a first gate stripe 402A, a second gate stripe 402B, a plurality of first source segments 404A, 404C corresponding to a first threshold voltage (normal Vt) and a plurality of second source segments 404B, 404D corresponding to a second threshold voltage (high Vt). In FIG. 4, the second threshold voltage is higher than the first threshold voltage. In the embodiment of FIG. 4, the total area of the first threshold voltage source segments is about 50% of the total source area and the total area of the second threshold voltage source segments is about 50% of the total source area. Gate stripes 402A and 402B overlap edges of the source segments. The exact edge dimensions of the source segments are not shown in FIG. 4 for convenience, but may be different from one another as was shown in FIGS. 2A and 2B in order to obtain the different threshold voltages. Other mechanisms are known for generating different source threshold voltages, in which case the exact edge dimensions of the source segments may be equal as is shown in FIG. 4. For example, the width of source 404A may have a dimension of 3.2 μm, and the width of source 404B may have a different dimension of 3.0 μm in an embodiment. The width of source 404A, however, may have the same dimensions as the width of source 404B in an embodiment, and yet have a different threshold voltage realized with a completely different mechanism, such as varying the dopant density of each source segment.

Figure 5:
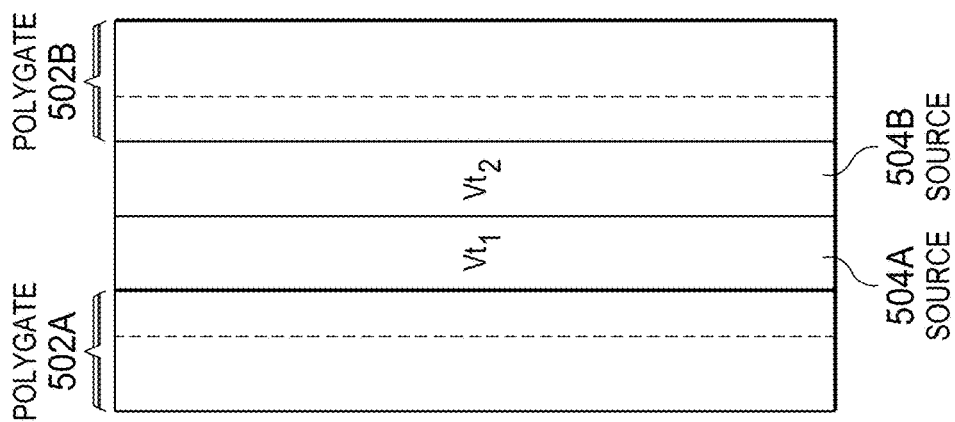
FIG. 5 is a plan view of a power device according to an embodiment comprising a dual threshold voltage stripe design comprising a first source stripe having a first threshold voltage and a second source stripe having a second threshold voltage.

FIG. 5 is a plan view of a power device according to an embodiment comprising a dual threshold voltage stripe design comprising a first polysilicon gate stripe 502A, a second polysilicon gate stripe 502B, a first source stripe 504A having a first threshold voltage, and a second source stripe 504B having a second threshold voltage. In the embodiment of FIG. 5, the total area of the first threshold voltage source stripe 504A is about 50% of the total source area and the total area of the second threshold voltage source stripe is about 50% of the total source area. Gate stripes 502A and 502B overlap edges of the source stripes. The exact edge dimensions of the source stripes are not shown in FIG. 4 for convenience, but may be different from one another as was shown in FIGS. 2A and 2B in order to obtain the different threshold voltages. Other mechanisms are known for generating different source threshold voltages, in which case the exact edge dimensions of the source segments may be equal as is shown in FIG. 5. For example, the width of source 504A may have a dimension of 1.50 μm, and width of source 504B may have a different dimension of 1.60 μm in an embodiment. The width of source 504A, however, may have the same dimensions as the width of source 504B in an embodiment, and yet have a different threshold voltage realized with a completely different mechanism, such as varying the dopant density of each source segment.

FIG. 6 is a plan view of a power device according to an embodiment comprising a multiple threshold voltage stripe design comprising a first polysilicon gate stripe 602A, a second polysilicon gate stripe 602B, a first source stripe 604A/604C having a first threshold voltage source segment 604A and a second threshold voltage source segment 604C, and a second source stripe 604B/604D having a third threshold voltage source segment 604B and a fourth threshold voltage source segment 604D. The gate stripes overlap the source segments as previously discussed. Source segment 604A occupies about 25% of the total source area and has a threshold voltage of Vt2, source segment 604B occupies about 25% of the total source area and has a threshold voltage of Vt3, source segment 604C occupies about 25% of the total source area and has a threshold of Vt1, and source segment 604D occupies about 25% of the total source area and has a threshold of Vt4, wherein at least two of the threshold voltage are different. In an embodiment, Vt1≠Vt2≠Vt3≠Vt4. The exact edge dimensions of the source segments may or may not be as shown in FIG. 6 for the reasons discussed above.

FIG. 7 is a plan view of a power device according to an embodiment comprising a laddered multiple threshold voltage design comprising a first polysilicon gate stripe 702A, a second polysilicon gate stripe 702B, a first threshold voltage source segment 704A, a second threshold voltage source segment 704B, a third threshold voltage source segment 704C, and a fourth threshold voltage source segment 704D. The gate stripes overlap the source segments as previously discussed. Source segment 704A occupies about 25% of the total source area and has a threshold voltage of Vt4, source segment 704B occupies about 25% of the total source area and has a threshold voltage of Vt3, source segment 704C occupies about 25% of the total source area and has a threshold of Vt2, and source segment 704D occupies about 25% of the total source area and has a threshold of Vt1, wherein at least two of the threshold voltage are different. In an embodiment, Vt1≠Vt2≠Vt3≠Vt4. The exact edge dimensions of the source segments may or may not be as shown in FIG. 7 for the reasons discussed above.

FIG. 8 is a plan view of a power device having a symmetrical checkered source according to an embodiment comprising a checkered source design having a first polysilicon gate stripe 802A, a second polysilicon gate stripe 802B, multiple threshold voltage source segments, comprising a first threshold voltage source segment 804B associated with the first gate stripe 802A, a second threshold voltage source segment 804A associated with the second gate stripe 802B, a third threshold voltage source segment 804D associated with the first gate stripe 802A, and a fourth threshold voltage source segment 304C associated with the second gate stripe 802B. The gate stripes overlap one edge of the source segments. Source segment 804A occupies about 12.5% of the total source area and has a threshold voltage of Vt4, source segment 804B occupies about 12.5% of the total source area and has a threshold voltage of Vt3, source segment 804C occupies about 12.5% of the total source area and has a threshold of Vt2, and source segment 804D occupies about 12.5% of the total source area and has a threshold of Vt1, wherein at least two of the threshold voltage are different. In an embodiment, Vt1≠Vt2≠Vt3≠Vt4. The exact edge dimensions of the source segments may or may not be as shown in FIG. 8 for the reasons discussed above.

The checkered source embodiment shown in FIG. 8 uses multiple Vt source segments as well as source segmentation (source segment not completely extending between both source stripes, for example). The embodiment of FIG. 8 thus combines both source segmentation (without the use of multiple Vt source segments) and multiple Vt aspects. The embodiment of FIG. 8 thus has a very high FBSOA, but also has a relatively minor Rdson penalty. Source segmentation is further discussed in co-pending U.S. patent application Ser. No. 16/167,915 entitled "Increasing Forward Biased Safe Operating Area by Source Segmentation", which is hereby incorporated by reference in its entirety.

FIG. 9 is a plan view of a power device having an asymmetrical laddered source according to an embodiment comprising an asymmetrical laddered dual source comprising a first gate stripe 902A, a second gate stripe 902B, a plurality of first source segments 904B, 904D having a first threshold voltage (normal Vt) and a plurality of second source segments 904A, 904C having a second threshold voltage (high Vt). In FIG. 9, the second threshold voltage is higher than the first threshold voltage. In the embodiment of FIG. 4, the total area of the first threshold voltage source segments is less than 50% of the total source area and the total area of the second threshold voltage source segments is more than 50% of the total source area. Gate stripes 902A and 902B overlap edges of the source segments. The exact edge dimensions of the source segments are not shown in FIG. 9, but may be different from one another as was shown in FIGS. 2A and 2B in order to obtain the different threshold voltages. Other mechanisms are known for generating different source threshold voltages, in which case the exact edge dimensions of the source segments may be equal as is shown in FIG. 9.

FIG. 10 is a plan view of a power device according to an embodiment comprising an asymmetrical multiple threshold voltage stripe design comprising a first polysilicon gate stripe 1002A, a second polysilicon gate stripe 1002B, a first source stripe 1004B/1004C having a first threshold voltage source segment 1004C and a second threshold voltage source segment 1004B, and a second source stripe 1004A/1004D having a third threshold voltage source segment 1004A and a fourth threshold voltage source segment 1004D. The gate stripes overlap the source segments as previously discussed. Source segment 1004A occupies about 25% of the total source area and has a threshold voltage of Vt3, source segment 1004B occupies about 25% of the total source area and has a threshold voltage of Vt2, source segment 1004C occupies about 25% of the total source area and has a threshold of Vt1, and source segment 604D occupies about 25% of the total source area and has a threshold of Vt4, wherein at least two of the threshold voltage are different. In an embodiment, Vt1≠Vt2≠Vt3≠Vt4. The exact edge dimensions of the source segments may or may not be as shown in FIG. 10 for the reasons discussed above.

In FIG. 10, the asymmetry of the design used can occur from the staggered bottom and top edges of the source segments and from the source area of the source segments. For example, while a 25% equal source area for each of the source segments with staggered bottom and top edges of the source segments can be used, the percentages of each of the source segments can be adjusted to be less than or greater than 25%. The total source area of the source segments may equal 100% of the total available source area, but source segmentation as shown in, for example, FIG. 9, may make the total source area less than 100% of the available source area.

FIG. 11 is a plan view of a power device having an asymmetrical checkered source according to an embodiment comprising an asymmetrical checkered source design having a first polysilicon gate stripe 1102A, a second polysilicon gate stripe 1102B, multiple threshold voltage source segments, comprising a first threshold voltage source segment 1104B associated with the first gate stripe 1102A, a second threshold voltage source segment 1104A associated with the second gate stripe 1102B, a third threshold voltage source segment 1104D associated with the first gate stripe 1102A, and a fourth threshold voltage source segment 1104C associated with the second gate stripe 1102B. The gate stripes overlap one edge of the source segments. Source segment 1104A occupies more than 12.5% of the total source area and has a threshold voltage of Vt2, source segment 1104B occupies less than 12.5% of the total source area and has a threshold voltage of Vt1, source segment 1104C occupies more than 12.5% of the total source area and has a threshold of Vt2, and source segment 704D occupies less than 12.5% of the total source area and has a threshold of Vt1, wherein the threshold voltages Vt1 and Vt2 are different. The exact edge dimensions of the source segments may or may not be as shown in Figure ii for the reasons discussed above.

The asymmetrical checkered source embodiment shown in FIG. 11 uses dual Vt source segments (multiple Vt source segments can also be used) as well as source segmentation (source segment not completely extending between both source stripes, for example). The embodiment of Figure ii thus also combines both source segmentation and dual or multiple Vt aspects. The embodiment of Figure ii thus has also has very high FBSOA, but also has a relatively minor Rdson penalty.

While device embodiments with source stripes and source stripe segments have been shown and described, embodiment concepts can be applied to trench gate device embodiments. A first portion of a power device can have a trenched gate and corresponding source segments having a first threshold voltage. A second portion of the power device can have a trenched gate and corresponding source segments having a second threshold voltage. The first and second threshold voltages can be realized with differences in the source segments dimensions, but can be also realized through other mechanisms such as, for example, changing source doping density values.

Figure 12A:
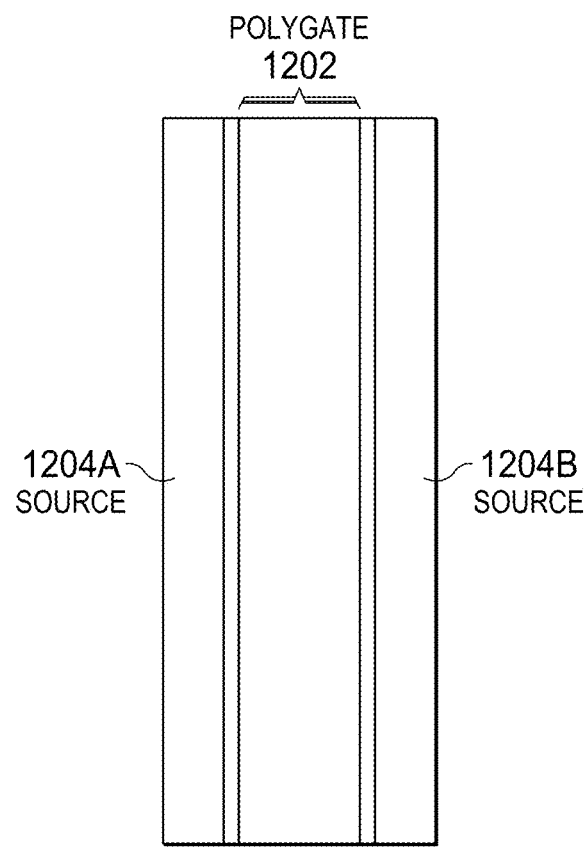
FIG. 12A is a plan view of a power device having a trenched gate according to the prior art.
Figure 12B:
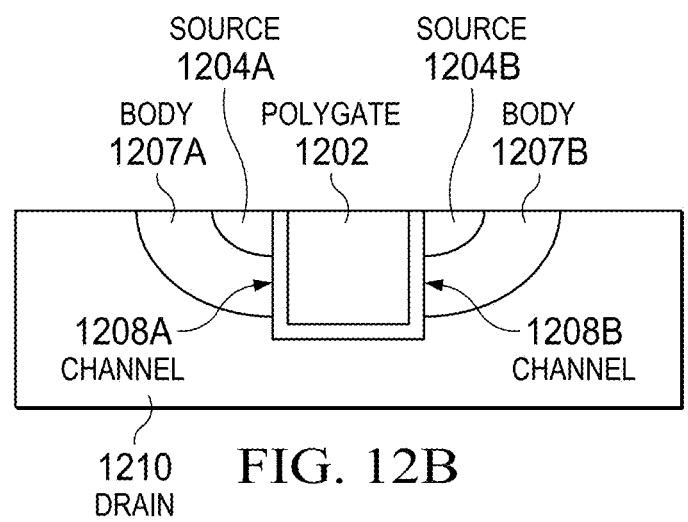
FIG. 12B is a cross-sectional view of the power device corresponding to the plan view of FIG. 12A.

FIG. 12A is a plan view of a conventional trenched gate power device having a polysilicon trench gate 1202 and two adjacent sources 1204A and 1204B. FIG. 12B is a cross-sectional view of the power device corresponding to the plan view of FIG. 12A, including trenched gate 1202, doped sources 1204A and 1204B, channel 1208A and 1208B, body 1207A and 1207B, and drain 1210 extending to a bottom surface of the power device. In FIGS. 12A and 12B the dimensions and doping densities of sources 1204A and 1204B are the same, and thus the trenched gate power device has a single threshold voltage.

Figure 13B:
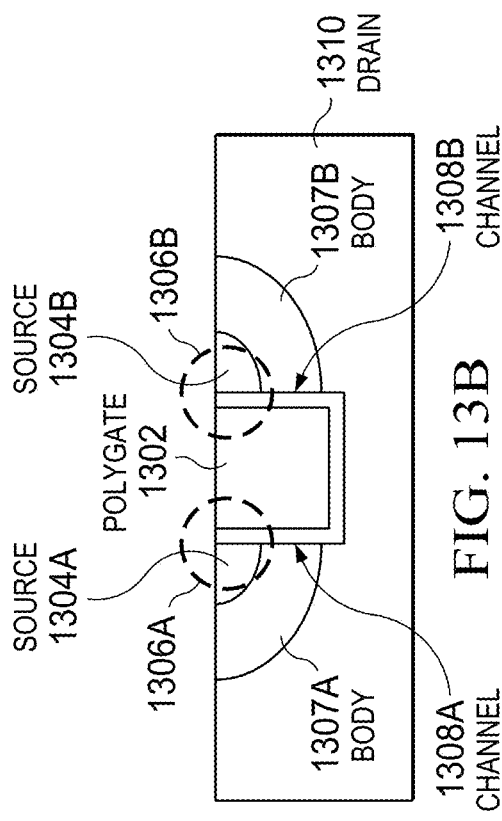
FIG. 13B is a first cross-sectional view of the power device corresponding to the plan view of FIG. 13A.
Figure 13C:
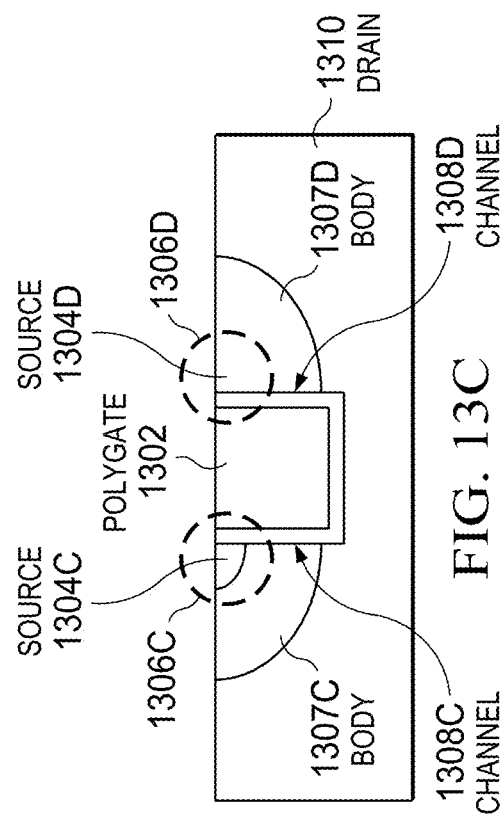
FIG. 13C is a second cross-sectional view of the power device corresponding to the plan view of FIG. 13A.
Figure 13A:
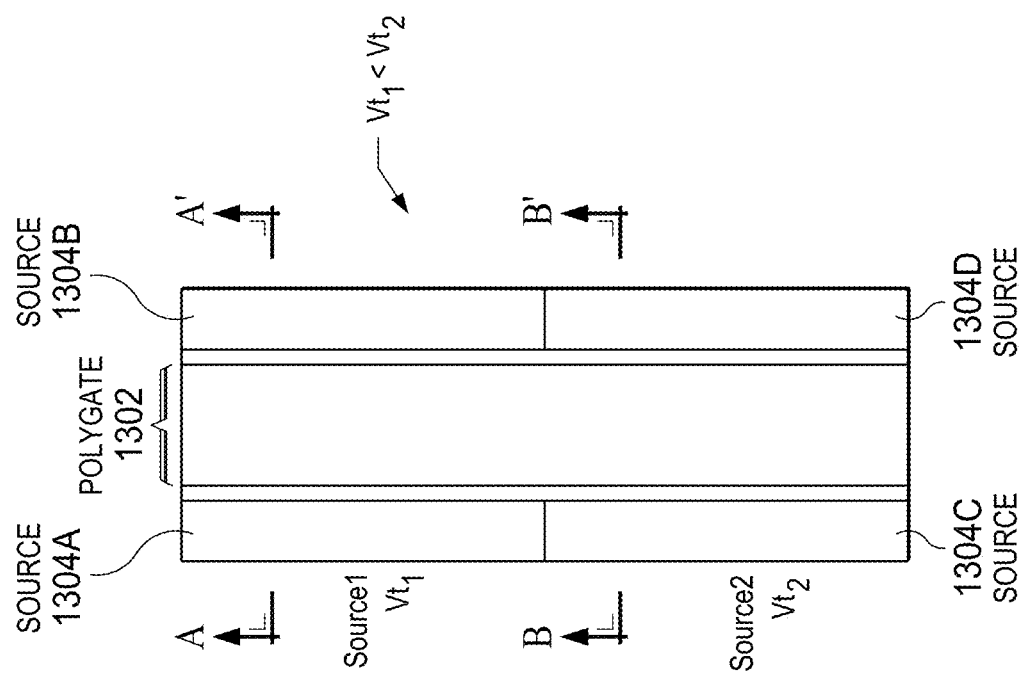
FIG. 13A is a plan view of a power device having a trenched gate and a segmented source including a first threshold voltage segment and a second threshold voltage segment according to an embodiment.

FIG. 13A is a plan view of a power device having a trenched gate 1302 and a laddered segmented source including sources 1304A, 1304B, 1304C, and 1304D according to an embodiment. In FIG. 13A the source depths are all shown as being equal for convenience. In some embodiments, the source depths may actually be equal and the differing corresponding threshold voltage are realized using a different mechanism such as source doping densities, for example. Thus, in an embodiment, the depth of sources 1304A and 1304B may be 0.20 μm, and the depth of sources 1304C and 1304D may be a different dimension of 0.10 μm. In another embodiment, the depth of sources 1304A, 1304B, 1304C, and 1304D may all be the same and the difference in threshold voltages may be realized for doping sources 1304A and 1304B to a first doping density, and doping sources 1304C and 1304D to a second doping density.

FIG. 13B is a first cross-sectional view of the power device corresponding to the plan view of FIG. 13A along line AA', including trenched gate 1302, doped source 1304A and 1304B, channel 1308A and 1308B, body 1307A and 1307B, and drain 1310 extending to a bottom surface of the power device. FIG. 13C is a second cross-sectional view of the power device corresponding to the plan view of FIG. 13A along line BB', including trenched gate 1302, doped source 1304C and 1304D, channel 1308C and 1308D, body 1307C and 1307D, and drain 1310 extending to a bottom surface of the power device.

Note that in FIGS. 13A, 13B, and 13C source segments 1304A and 1304B are associated with a first threshold voltage Vt1 and source segments 1304C and 1304D are associated with a second threshold voltage Vt2. The threshold voltages Vt1 and Vt2 have different values in an embodiment. While only the laddered segmented source technique is described and shown in the trench device example of FIGS. 13A, 13B, and 13C any of the other source segmentation techniques having source segments with differing threshold voltages described herein can be used as well.

FIG. 14 illustrates plan views of various power device cell configurations suitable for comprising segmented sources (with the same or different threshold voltages) according to embodiments. Shown in the table 2200 of FIG. 14 are seven different cellular designs commonly used for power devices. Table 2200 shows a linear cell 2202 and a square well in a square cell 2204. The linear cell 2202 was previously shown and described with respect to FIGS. 4 through 13A. The square well in a square cell is shown and described in further detail below with respect to FIGS. 15A through 15C. In general the "well" designation will correspond to the source layout configuration, and the "cell" designation will correspond to the outer polysilicon gate layout configuration. Thus, table 2200 also shows a circular well in a square cell 2206, a hexagonal well in a square cell 2208, a square well in a hexagonal cell 2210, a circular well in a hexagonal cell 2212, and a hexagonal well in a hexagonal cell 2214. Rectangular cells are also used. The source segmentation previously illustrated and described, particularly with respect to FIGS. 21B and 21C, can be applied to any of these cellular layouts. For example a segmented source can be used where the cell comprises a square, rectangular, or hexagonal cell. A segmented source can be used where source perimeter comprises a square, circle, rectangle or hexagonal perimeter. Any of the other source segmentation features shown and previously described with respect to the linear cell can also be used, for example the use of evenly or irregularly spaced source segments or the use of source segments with rounded corners. Cellular power devices having segmented sources can also be used in the radial variation of the source segmentation according to embodiments, which is described in further detail below.

Figure 15A:
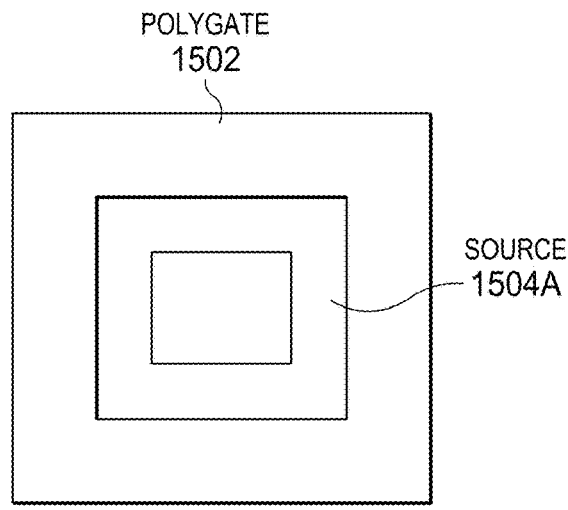
FIG. 15A is a plan view of cellular power device having a square source in a square cell according to the prior art.

FIG. 15A is a plan view of an exemplary cellular power device having a square source 1504 in a square cell 1502 according to the prior art. The cellular power device shown in FIG. 15A has a single threshold voltage as is known in the art.

Figure 15B:
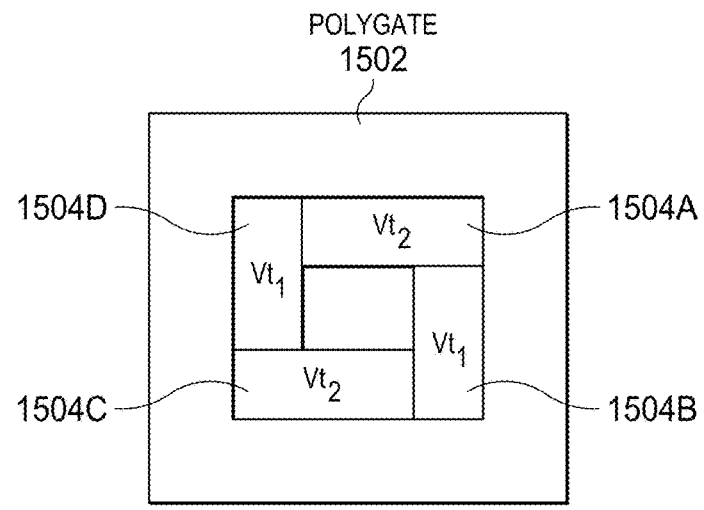
FIG. 15B is a plan view of a cellular power device having a segmented square source with two threshold voltage source segments in a square cell according to an embodiment.

FIG. 15B is a plan view of a cellular power device having a segmented square source with two source segments 1504B and 1504D having a first threshold voltage Vt1 and two source segments 1504A and 1504C having a second threshold voltage Vt2 in a square cell 1502 according to an embodiment. In the embodiment of FIG. 15B the threshold voltages Vt1 and Vt2 are different.

Figure 15C:
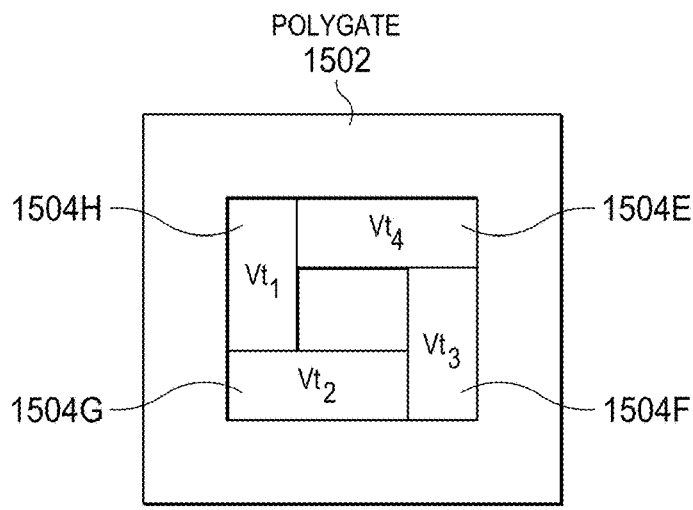
FIG. 15C is a plan view of a cellular power device having a segment square source with four threshold voltage source segments in a square cell according to an embodiment.

FIG. 15C is a plan view of a cellular power device having a segmented square source with four source segments 1504E having a threshold voltage Vt4, 1504F having a threshold voltage Vt3, 1504G having a threshold voltage Vt2, and 1504H having a threshold voltage Vt1, all in a square cell 1502 according to an embodiment. In an embodiment at least two of the threshold voltages are different from each other, and Vt1≠Vt2≠Vt3≠Vt4 in an embodiment.

While checkered source, laddered source, and cellular source segmented patterns have been shown, other geometrical patterns can be used for source segmentation and for using sources or source segments with differing threshold voltages. Some examples of segmented sources were shown and described above, but are not intended to be limiting. Other such segmented source patterns can be made for improving thermal stability at higher operating voltages.

The pattern pitch (for example the ladder or checker pitch) is ideally kept small so that temperature is uniform across the device. A range of few microns to tens of microns can be used in an embodiment.

FIG. 16 is a table 1600 of simulation results for assessing the performance of segmented source devices with multiple threshold voltage segments according to embodiments. Source segmentation is compared for a conventional device (100% source area utilized corresponding to, for example the device FIG. 3), for a 50% Gm device (only 50% of the available source area utilized corresponding to, for example the device of FIG. 3 altered to include only half of the source width), with a first dual threshold voltage device (corresponding to the device of FIG. 5), and with a second dual threshold device (corresponding to the device of FIG. 5 but with different threshold voltages as shown). Parameters simulated include threshold voltage Vt1, threshold voltage Vt2, differential threshold voltage (ΔVt), temperature divergence (Tm divg), and source-drain on resistance (Rdson). Temperature divergence refers to the maximum temperature divergence within each of the simulated devices. A higher value of temperature divergence is undesirable since high temperature divergence can designate "hot spots" within the device that can lead to thermal runaway and device destruction even though the device is operated within maximum current and voltage limits. Using the 50% Gm device, Tm divergence is reduced to almost half that of the conventional design. However, Rdson increases significantly (about a 35% increase). Using the dual Vt approach as described herein, a similar Tm divergence reduction is realized with a negligible Rdson increase (<5%). FBSOA can therefore be improved with only a negligible impact on Rdson. On higher voltage power devices, the Rdson increase is even smaller with a correspondingly improved FBSOA.

FIG. 17 is a table 1700 of experimental results for assessing the performance of segmented source devices according to embodiments. A conventional power device was measured with a safe drain current range of 2.7 to 3.3 amperes. A dual Vt stripe device (as shown in, for example, FIG. 5) was measured with a safe drain current range of 3.7 to 4.0 amperes. The corresponding drain-to-source on resistance Rdson was measured as 48 mΩ for both devices. A 100V P-channel lot of power devices was run with a dual Vt using stripe design (wherein each side has a different Vt source). The dual Vt design had a higher FBSOA capability (30% more) and also lower part to part variation (tighter range). The improvements to FBSOA capability were realized with no increase in Rdson.

For example, a specific point on the FBSOA curve at high voltage is measured to determine the higher FBSOA capability. The drain voltage is set to Vd=80V, the duration of the test is set to t=10 ms, and drain failure current Id is found. The same test conditions are used for both designs, and many devices from each group are measured. The dual Vt design referred to above has a better (higher) Id or FBSOA and a lower part-to-part variation. An 80% rated maximum Vd represents the maximum voltage seen in some applications.

Figure 18:
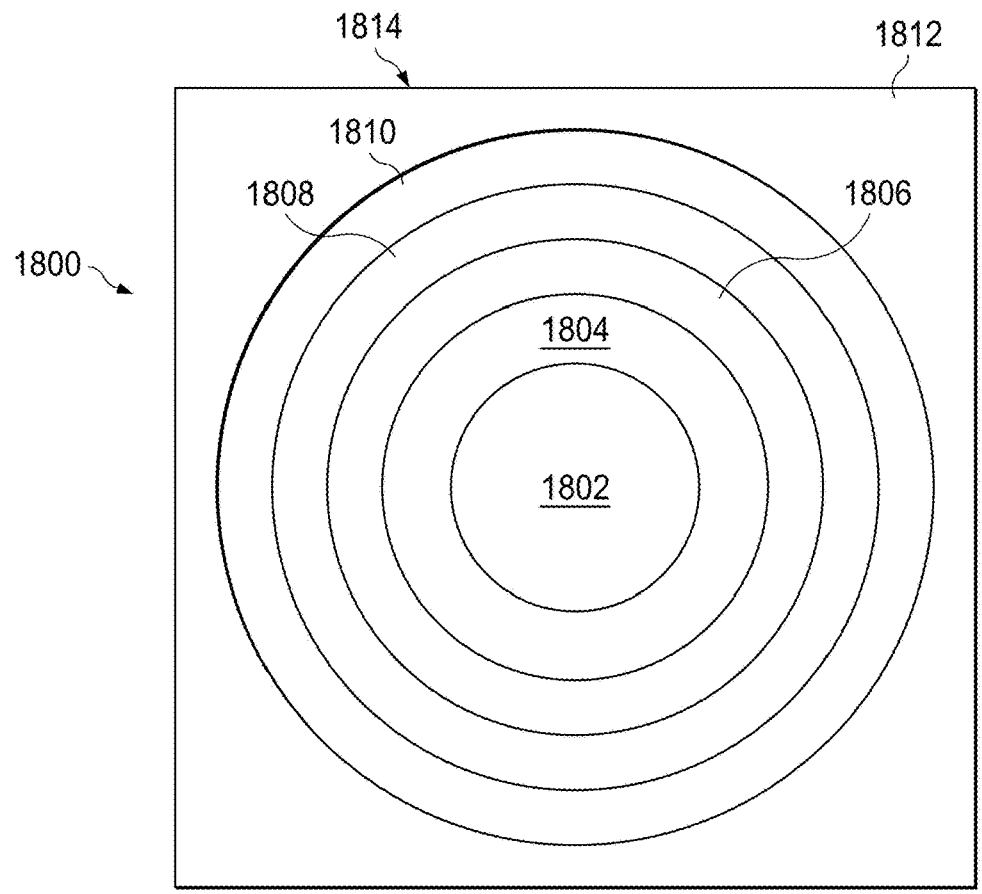
FIG. 18 is a plan view of the simulated thermal resistance of an integrated circuit die comprising a power device, in an embodiment.

FIG. 18 is a plan view of a power device die 1800 showing radial variations of die thermal impedance. The die center of power device 1802 has the highest thermal impedance $R_{th}$ and the edges of power device 1814 have the lowest thermal impedance $R_{th}$. Die temperature is thus at a maximum in center zone 1802, and gradually decreases through intermediate zones 1804, 1806, 1808, and 1810. Die temperature is at a minimum in edge zone 1814. This distribution of thermal impedance leads to thermal instability and FBSOA failure near the center of the die. The ratio of the threshold voltages used in the source segments, as well as source segmentation itself, can be adjusted within each of the temperature zones in order to maximize FBSOA, which is described in further detail below.

Figure 19:
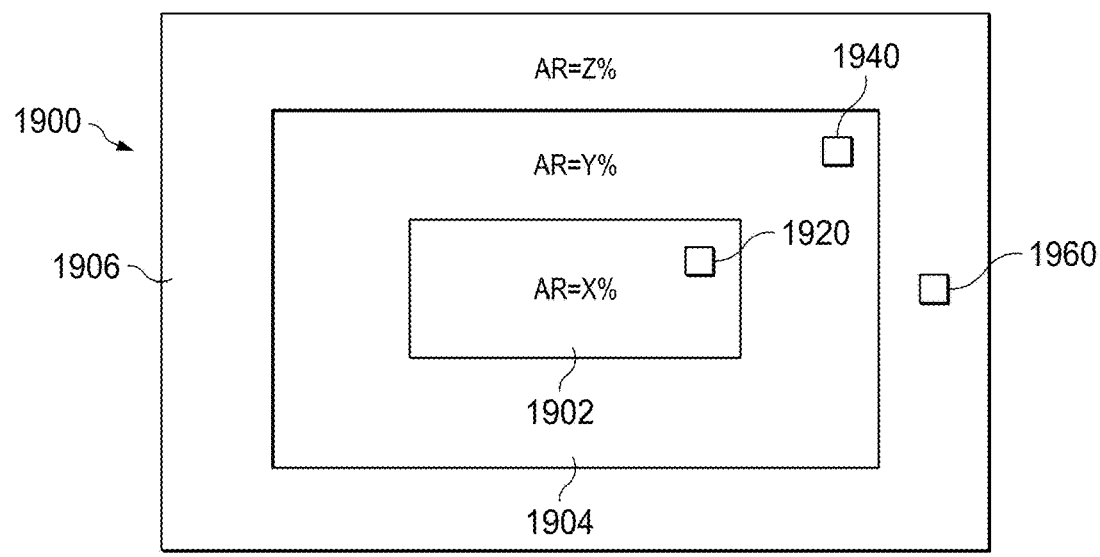
FIG. 19 is a plan view of a rectangular die layout schematic according to an embodiment, having a first source segment area ratio in an inner portion of the die, a second source segment area ratio in a middle portion of the die, and a third source segment area ratio in an outer portion of the die.

FIG. 19 is a plan view of a power device 1900 comprising rectangular radial variation of the ratio of the threshold voltage source segmentation according to an embodiment using concentric source segmentation zones, and more specifically using a plurality of rectangular concentric source segmentation zones. The power device 1900 includes a first zone 1902 including a plurality of devices 1920 having a first ratio of a first threshold voltage source segmentation to a second threshold voltage source segmentation. The threshold voltage source segmentation ratio can be realized within a cell as has been described, or can also be realized by using a mixture of cells 1920 having a first threshold voltage and cells 1920 having a second threshold voltage. The power device 1900 includes a second zone 1904 including a plurality of devices 1940 having a second ratio of a first threshold voltage source segmentation to a second threshold voltage source segmentation. The threshold voltage source segmentation ratio can be realized within a cell as has been described, or can also be realized by using a mixture of cells 1920 having a first threshold voltage and cells 1920 having a second threshold voltage. The power device 1900 includes a third zone 1906 including a plurality of devices 1960 having a third ratio of a first threshold voltage source segmentation to a second threshold voltage source segmentation. The threshold voltage source segmentation ratio can be realized within a cell as has been described, or can also be realized by using a mixture of cells 1920 having a first threshold voltage and cells 1920 having a second threshold voltage. Additional zones can be used. Zone 1902 may be configured to have more higher threshold cells 1920 than the higher threshold cells 1940 in zone 1904, and in turn, zone 1904 may be configured to have more higher threshold cells 1940 than the higher threshold cells 1960 in zone 1906, in order to make the temperature distribution more uniform across the entire device 1900.

As previously discussed, the power device die 1900 has an inherent thermal resistance (Rth) variation from center to edge with center having higher Rth. This variation causes the center of the die to be hotter and the non-uniform temperature distribution on the die reduces the maximum FBSOA capability. The non-uniform temperature distribution can be compensated using different threshold voltage source segment ratios in zone to match the temperature distribution so that the maximum FBSOA can be improved.

The center area or zone 1902 can use a higher Vt area ratio (AR) to reduce the device current flow in this zone during the FBSOA. This matching of the Vt area ratio to the highest temperature zone keeps the center zone 1902 cooler, thus improving FBSOA capability. The ratio is gradually decreased in concentric zones towards the die edges to achieve a more uniform temperature across the whole die. Zone 1904 thus has a medium Vt area ratio, and zone 1906 has the lowest Vt area ratio. Source segmentation can also be used in conjunction with the adjustment in Vt area ratios to further improve FBSOA capability. The improvement in FBSOA using Vt area ratios is given in the equations below:

wherein AR=the area ratio of the total source segment area of a first source S1 having a first threshold voltage Vt1 to the total source segment area of a second source segment S2 having a second threshold voltage Vt2, wherein Vt1 of S1>Vt2 of S2, and wherein the area ratio of zone 1902 "X">=the area ratio of zone 1904 "Y">=the area ratio of zone 1906 "Z".

In the example of FIG. 19, a three step variation is shown, including rectangular zones 1902, 1904, and 1906. Additional or fewer zones can be used. A gradual decrease in the Vt area ratio using additional zones more effectively cancels out the Rth decrease on the die.

Figure 20:
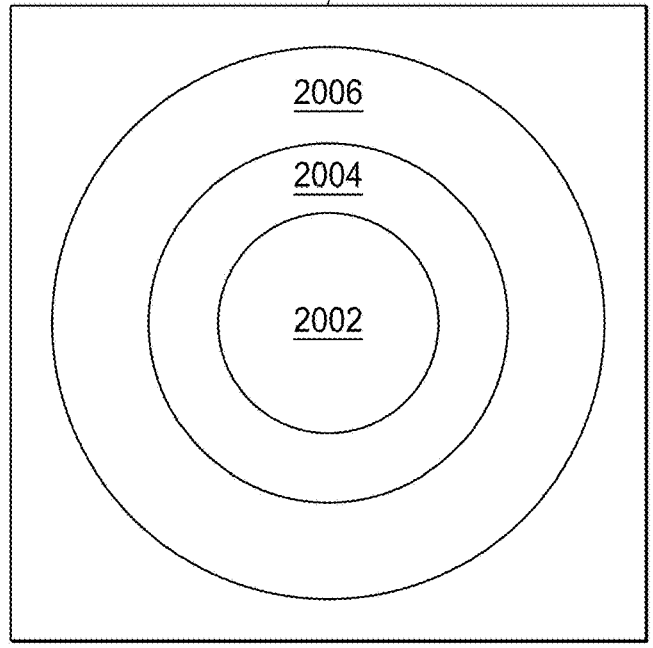
FIG. 20 is a plan view of a power device die comprising a circular radial variation of the source segmentation ratio according to an embodiment.

FIG. 20 is a plan view of a power device 2000 comprising a circular radial variation of the Vt area ratio and/or source segmentation according to an embodiment. Circular concentric Vt area ratio and/or source segmentation zones 2002, 2004, 2006, and 2008 are shown, all including a plurality of device cells. Source segmentation zone 2002 includes the greatest ratio of high threshold voltage source area to low threshold voltage source area, zone 2004 includes the next greatest ratio of high threshold voltage source area to low threshold voltage source area, zone 2006 includes the next greatest ratio of high threshold voltage source area to low threshold voltage source area, and zone 2008 includes the lowest ratio of high threshold voltage source area to low threshold voltage source area. In this way, the temperature distribution across the device 2000 can be made more uniform, and the FBSOA of device 2000 can be maximized.

The Vt area ratio and/or source segmentation percentage is varied from the center of the die (zone 2002) to the edge of the die (zone 2008). The maximum Vt area ratio is in the center zone 2002, and increases to a minimum Vt area ratio in the edge zone 2008. The circular radial variation of the Vt area ratio shown in FIG. 20 may more closely track thermal variations in actual power devices than the rectangular variation shown in FIG. 19.

Figure 21:
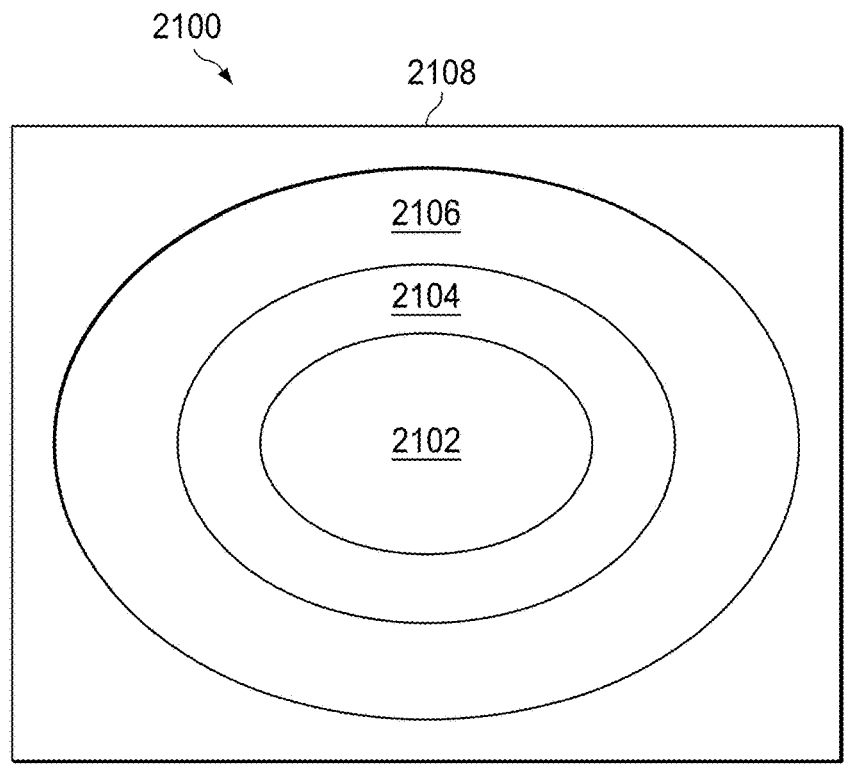
FIG. 21 is a plan view of a power device die comprising an oval radial variation of the source segmentation ratio according to an embodiment.

FIG. 21 is a plan view of a power device 2200 comprising an oval radial variation of the Vt area ratio and/or source segmentation according to an embodiment. Oval concentric Vt area ratio and/or source segmentation zones 2102, 2104, 2106, and 2108 are shown. Each zone includes a plurality of cells having different source threshold voltages as previously described with respect to FIGS. 19 and 20. The Vt area ratio and/or source segmentation percentage is varied from the center of the die (zone 2102) to the edge of the die (zone 2108). The maximum Vt area ratio is in the center zone 2102, and increases to a minimum Vt area ratio in the edge zone 2108. The oval radial variation of the Vt area ratio shown in FIG. 21 may more closely track thermal variations in actual power devices than the rectangular variation shown in FIG. 20.

In FIGS. 19, 20, and 21 the segmented sources having differing threshold voltage source segments can comprise checkered sources, laddered sources, or cellular sources, or any combinations thereof. The type of segmented sources and the Vt area ratio thereof can be the same in a plurality of concentric zones, or can be varied from one zone to another, or even within a single zone as may be required for a specific implementation. The Vt area ratio within a zone can be realized by using segmented sources within a cell, or a mixture of first and second cells, wherein a first cell has a corresponding first threshold voltage and a second cell has a corresponding second threshold voltage, or a combination of any of these cells to effect a ratio of source segments having different threshold voltages within a zone as desired.

For more complicated embodiments having four source segments each having a corresponding threshold voltage, a source segment ratio can be calculated in various ways for use in the concentric zones described above. For example, if A1 is the total area of the first threshold segments having a threshold voltage of Vt1, A2 is the total area of the second threshold segments having a threshold voltage of Vt2, A3 is the total area of the third threshold segments having a threshold voltage of Vt3, and A4 is the total area of the fourth threshold segments having a threshold voltage of Vt4, the following relevant equations can be used.

For example the following two sets of equations can be used, but many other such equations can be used as will be apparent to those skilled in the art:

$$A1=A2=A3=A4;\ Vt1>Vt2>Vt3>Vt4 \quad\quad 1.$$

$$A1/A2=K12,\ A2/A3=K23,\ A3/A4=K34;$$
$$Vt1>Vt2>Vt3>Vt4 \quad\quad 2.$$

$$K12=K23=K34<1 \quad\quad (a)$$

$$K12<K23<K34 \quad\quad (b)$$

$$K12<K23<K34<1] \quad\quad (c)$$

According to embodiments described herein, the FBSOA of power devices may be improved without a significant increase in Rdson or without the need for other tradeoffs. In other words, the use of multiple Vt source segments as described achieves an improvement in FBSOA as well as an acceptable Rdson in the same power device. The area ratios of multiple Vt source segments can be varied to tune the FBSOA within a power device. The area ratio can be varied geographically on the die within concentric zones as well to compensate inherent thermal resistance variation, for example the center of the die could have higher Vt area ratio than edges of the die. Dual (or multiple) Vt source segments can be achieved using various methods described herein. In some embodiments Vt source segments may be uniformly distributed to promote a more uniform temperature distribution. A ΔVt of about 10-30% is recommended for the best tradeoff between FBSOA and Rdson. Values outside of this range could also be used based on the requirements of a specific application. The multiple Vt source segments and other source segmentation embodiments described herein can be easily combined with other known FBSOA improvement techniques to achieve additional benefits.

While certain values and ranges for threshold voltages, area ratios, and other features of described embodiments have been given, it will be apparent to those skilled in the art that these values and ranges can be changed to accommodate specific implementations and applications.

It will thus be apparent to those skilled in the art that device structures including source segmentation including differing threshold voltages and threshold voltage ratios as described herein can be extended to any other power device structure such as planar, trench, vertical, and charge balanced devices and also various device types including MOSFET, Insulated Gate Bipolar Transistors ("IGBT"), and Injection-Enhanced Gate Transistor ("IEGT") devices. The examples listed immediately above are not meant to be limiting.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:
1. A device comprising:
   a gate; and
   a segmented source proximate to the gate, wherein the segmented source comprises a plurality of first segments having a first threshold voltage and a plurality of second segments having a second threshold voltage different from the first threshold voltage,
wherein the segmented source comprises a symmetrical checkered source or an asymmetrical checkered source.

2. The device of claim 1, wherein the segmented source further comprises a plurality of third segments having a third threshold voltage different from the first and second threshold voltages.

3. The device of claim 2, wherein the segmented source further comprises a plurality of fourth segments having a fourth threshold voltage different from the first, second, and third threshold voltages.

4. The device of claim 1, comprising an additional segmented source comprising a symmetrical laddered source or an asymmetrical laddered source.

5. The device of claim 1, comprising an additional segmented source comprising a plurality of continuous, segmented, or staggered stripes.

6. The device of claim 1, comprising at least one segmented source configured between two polysilicon gates.

7. The device of claim 1, comprising at least one trenched gate configured between two segmented sources.

8. The device of claim 1, wherein the plurality of first segments has a first dopant density and the plurality of second segments has a second dopant density different from the first dopant density.

9. A device comprising:
a plurality of concentric source segmentation zones extending from a center of the device to edges of the device, wherein each concentric source segmentation zone comprises:
a gate; and
a segmented source proximate to the gate, wherein the segmented source comprises a plurality of first segments having a first threshold voltage and a plurality of second segments having a second threshold voltage less than the first threshold voltage,
wherein an area ratio of a total area of the plurality of first segments to a total area of the plurality of second segments varies according to a distance of the concentric source segmentation zone from the center of the device.

10. The device of claim 9, wherein the area ratio is at a maximum within a concentric source segmentation zone closest to the center of the device, and at a minimum within a concentric source segmentation zone closest to the edges of the device.

11. The device of claim 9, wherein the plurality of concentric source segmentation zones comprises a plurality of oval or ellipse shaped concentric source segmentation zones.

12. The device of claim 9, wherein the plurality of concentric source segmentation zones comprises a plurality of circular concentric source segmentation zones.

13. The device of claim 9, wherein the plurality of concentric source segmentation zones comprises a plurality of rectangular concentric source segmentation zones.

14. The device of claim 9, wherein the segmented source comprises a symmetrical laddered source or an asymmetrical laddered source.

15. The device of claim 9, wherein the segmented source comprises a plurality of continuous, segmented, or staggered stripes.

16. The device of claim 9, wherein the segmented source comprises a symmetrical checkered source or an asymmetrical checkered source.

17. A device comprising:
a plurality of cells, wherein each cell comprises:
a gate region on an upper surface of a device, wherein an inner perimeter of the gate region defines a source perimeter; and
a segmented source adjacent to the source perimeter, wherein the segmented source comprises a plurality of first segments having a first threshold voltage and a plurality of second segments having a second threshold voltage different from the first threshold voltage.

18. The device of claim 17, wherein the segmented source comprises a plurality of third segments having a third threshold voltage different from the first and second threshold voltages.

19. The device of claim 17, wherein the cell comprises a square, rectangular, hexagonal, or polygonal cell.

20. The device of claim 17, wherein the source perimeter comprises a square, circle, rectangle, hexagonal, or polygonal perimeter.

* * * * *